United States Patent
Tharumalingam et al.

(10) Patent No.: US 6,864,167 B1
(45) Date of Patent: Mar. 8, 2005

(54) WAFER SCALE SOLDER BUMP FABRICATION METHOD AND STRUCTURE

(75) Inventors: Sri Ganesh A. I. A. Tharumalingam, Melaka (MY); Zabarulla Bin Hanifah, Melaka (MY); Lim King Tong, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 115 days.

(21) Appl. No.: 10/364,051

(22) Filed: Feb. 10, 2003

(51) Int. Cl.[7] .................. H01L 21/44; H01L 21/461; G03C 5/00
(52) U.S. Cl. .................. 438/613; 438/725; 438/781; 430/312; 430/313
(58) Field of Search .................. 438/725, 781, 438/613, 637, 942; 430/312, 313

(56) References Cited

U.S. PATENT DOCUMENTS

| | | | | |
|---|---|---|---|---|
| 4,301,237 A | * | 11/1981 | Burns | 430/394 |
| 5,453,701 A | * | 9/1995 | Jensen et al. | 324/755 |
| 5,824,457 A | * | 10/1998 | Liu et al. | 430/394 |
| 6,181,569 B1 | * | 1/2001 | Chakravorty | 361/761 |
| 6,623,912 B1 | * | 9/2003 | Ching et al. | 430/314 |

OTHER PUBLICATIONS

Wolf et al. "Silicon Processing For The VLSI Era", Lattice Press, 1986, pp. 407–408.*

* cited by examiner

Primary Examiner—Ha Tran Nguyen
(74) Attorney, Agent, or Firm—Beyer Weaver & Thomas LLP

(57) ABSTRACT

A process and structure for the wafer scale fabrication of packaged semiconductor dies having solder bumps of less than about 300 $\mu$. A method of forming solder bump electrical connections to electrical contact pads for semiconductor dies includes providing a semiconductor wafer having a plurality of semiconductor dies and associated electrical contact pads formed thereon. A passivation layer is formed and then covered with a layer of photodefinable material. The photodefinable material is patterned in a two-step process. In the first step, a developed photo mask ring is formed around the periphery of wafer. A central portion of the layer of photodefinable material is left for further photodefinition. In a second step, a pattern of openings is formed (in registry with registration with the underlying electrical contact pads) in the central portion. The exposure of the developed photo mask ring in the first step prevents the formation of openings around the periphery of wafer. Solder bumps are then formed by screen-printing solder into the pattern of openings to form solder bumps for the electrical contact pads. The wafer is singulated to form individual semiconductor dies.

13 Claims, 4 Drawing Sheets

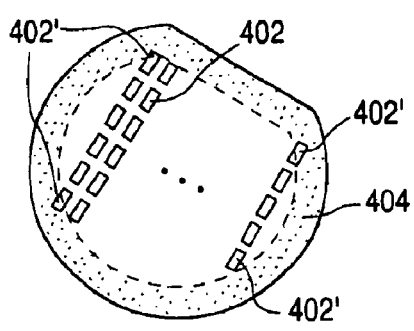
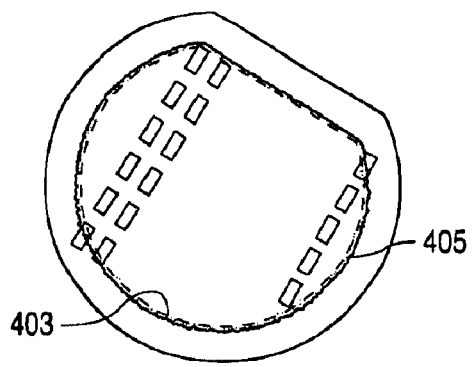
FIG. 4(c)
(PRIOR ART)
FIG. 4(d)
(PRIOR ART)
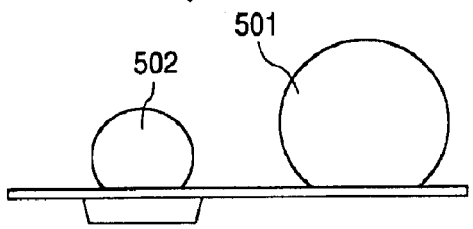
FIG. 5
(PRIOR ART)
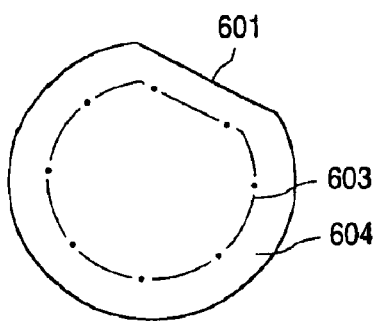
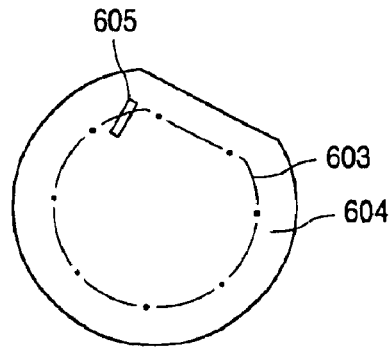
FIG. 6(a)
FIG. 6(b)
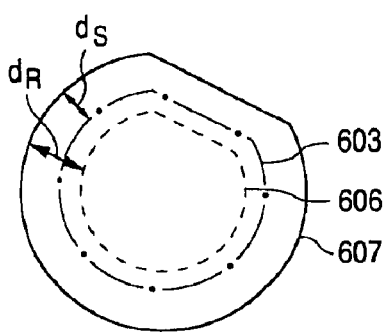
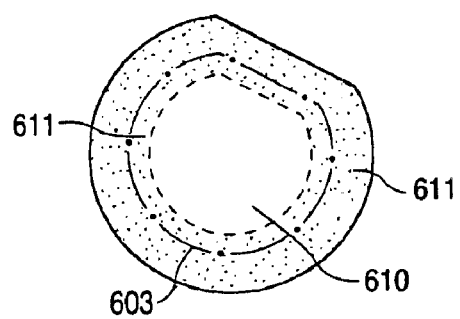
FIG. 6(c)
FIG. 6(d)

US 6,864,167 B1

WAFER SCALE SOLDER BUMP FABRICATION METHOD AND STRUCTURE

TECHNICAL FIELD

The invention described herein relates generally to semiconductor chip manufacturing processes. In particular, the invention relates to an improved process for fabricating solder bumps in a wafer scale die packaging process.

BACKGROUND

One step in the manufacture of integrated circuit devices is known as "packaging" and involves mechanical and environmental protection of a semiconductor chip which is at the heart of the integrated circuit. Such packaging includes the electrical interconnections between predetermined locations on the silicon chip and external electrical terminals. One new process for packaging such chips seeks to package the chips and create solder bump electrical connections to the chip while the chips are still in place on an un-singulated wafer. By fabricating and packaging chips together in this manner the size of the final chip package is substantially reduced.

One currently used approach for chip fabrication is described hereinbelow. FIG. 1 depicts a semiconductor wafer 101 having a multiplicity of semiconductor integrated circuit dies 102 formed thereon. FIG. 2 is a simplified depiction of one example of such an integrated circuit die 102. The die 102 includes a plurality of electrical contact pads 103 (also referred to as input/output (I/O) contacts) formed thereon. The electrical contact pads 103 facilitate electrical connection of the die 102 with off-chip circuitry, such as printed circuit boards (PCB's) or other electronic devices. If such integrated circuit dies 102 and their associated electrical connections can be formed together on a wafer, numerous process advantages can be had.

Thus, many methodologies for such wafer-scale or wafer level chip scale packages are under development. One existing methodology is described herein as an example. FIG. 3(a) is a simplified illustration of a portion of semiconductor die during an example wafer-scale packaging process. As previously indicated, a wafer has a multiplicity of semiconductor integrated circuit dies formed thereon. The depicted semiconductor die 301 has an electrical contact pad 302 formed thereon. The contact pads 301 are commonly formed of aluminum. The contact pad 301 is electrically connected to electrical circuitry (not shown in this view) of the die 301 (e.g., using the via 303).

As depicted in FIGS. 3(b) & 3(c), a passivation layer 304 is formed over the substrate (including the die 301 and associated electrical contact pads 302). Such passivation layers 304 can be formed of numerous dielectric materials (e.g., $SiO_2$, low-K dielectrics, and other passivation materials). One preferred passivation material is benzocyclo-butene (BCB). Conventional techniques (e.g., spin coating, etc.) can be used to form the passivation layer 304. In some implementations, the BCB passivation layer is formed about 5–6 microns thick. Using conventional photolithographic processes, openings 305 are formed in the passivation layer 304. The openings 305 are configured such that they are in register with the underlying electrical contact pads 302.

FIG. 3(d) shows the formation of an adhesion layer 306 designed to provide good adhesion with the underlying aluminum electrical contact pads 302 and also provide good adhesion to subsequently formed solder connections. This adhesion layer 306 is also referred to as under bump metallization (UBM). Commonly, the UBM 306 is formed of a multi-layer structure. In the depicted embodiment, the UBM 306 includes an aluminum first layer 307, formed on the electrical contact pads 302, a nickel/vanadium (Ni/V) alloy second layer 308 formed on the first layer 307, and a copper third layer 309 formed on the second layer 308. Commonly, the UBM 306 is formed by successive depositions of the first, second, and third layers onto the entire wafer. Subsequently, these layer are photolithographically patterned and then etched so that the UBM 306 remains only on the electrical contact pads 302. Such photolithographic patterning and subsequent etching is accomplishing using ordinary techniques known to persons having ordinary skill in the art.

With respect to FIGS. 3(e), 3(f), and 3(g) solder bumps are formed at various points throughout the entire wafer. Ordinary direct ball attach methods cannot be used when the solder bump size becomes less than about 300 micron ($\mu$m). Thus, so-called solder screen printing technologies are used to form sufficiently small bumps. Many examples of suitable processes are well known to those having ordinary skill in the art. The depicted process uses screen-printing to form a multiplicity of solder bumps throughout the entire wafer. This conventional process and some of its limitations are described below. FIG. 3(e) is a simplified depiction of a portion of a single die 301 on a wafer. In order to form solder bumps over the entire surface of the wafer, a photoresist pattern 311 is formed over the entire surface of the wafer. The photoresist pattern 311 functions as a template for the placement of the solder bumps. The photoresist pattern 311 has a pattern of openings 312 formed in registry with the underlying electrical contact pads 302. The pattern of openings is typically formed with conventional photolithographic techniques. As shown in FIG. 3(f), solder paste 313 is screen printed into the openings 312 formed in the photoresist pattern 311. As shown in FIG. 3(g), the solder paste 313 is reflowed and the photoresist pattern 311 is removed to leave a pattern of appropriately positioned solder bumps 315.

It is the screen print application of solder paste that presents certain process difficulties in known methodologies. These difficulties can be more easily understood with respect to FIGS. 4(a)–4(d). FIGS. 4(a)–4(d) are simplified schematic plan views of a semiconductor wafer during a solder bump forming process. FIG. 4(a) is a simplified schematic plan view of a semiconductor wafer 401 having a layer of photoresist material formed thereon (e.g., before the patterning step of FIG. 3(e)). FIG. 4(b) depicts patterning of the photoresist layer to form a pattern of openings 402 that expose the underlying electrical contact pads of the semiconductor dies. Also, shown in FIG. 4(b) is a dashed line which schematically demarcates the outer edge 403 of a screen print stencil used in the application of solder paste into the openings 402. Because the pattern of openings 402 formed in the photoresist is formed using photolithographic stepper device the pattern of openings 402 extends beyond the outer edge 403 of a screen print stencil. This has significant consequences that will be discussed later.

After the application of solder paste during a conventional screen printing process, the openings 402 are filled with solder paste. It is noted that during the screen printing process excess solder paste is applied to the stencil and the wafer. The excess solder paste is removed by scraping the paste from the stencil. However, this does not remove all the paste from the wafer 401. Thus, as depicted in FIG. 4(c) a ring 404 of excess solder paste is formed around the outer edge of the now removed stencil. Additionally, certain edge openings 402' near the edge of the photolithographic pattern extend into the portions of the wafer where the ring 404 of excess solder paste is formed. During reflow, these edge openings 402' form excessively large solder bumps relative to solder bump formed in the other openings 402. This phenomenon is schematically illustrated in FIG. 5 which shows an oversize edge solder bump 501 formed by the excess solder pooling from the ring of excess paste formed on the outer edge of the wafer. This is in comparison to the smaller bumps 502 formed over much of the rest of the wafer surface. The presence of the oversize bumps causes a myriad of problem. Examples include, but are not limited to, difficulties in correctly aligning the chip when it is to be attached to other devices or PCB's. Also, the chips suffer from breakage during further processing due to the fact that the chips cannot be laid flat for processing and the resulting strains placed on the chips during such processing cause breakage.

FIG. 4(*d*) illustrates one conventional approach for addressing these above problems. FIG. 4(*d*) illustrates the wafer of FIG. 4(*c*) after the edge of the wafer is scraped to remove excess solder paste. Currently, this must be done by hand. Moreover, current scraping processes result in the contamination of the pallets that hold the wafers. Additionally, automated approaches result in worse contamination. Moreover, even after scraping, a thin band 405 of solder paste still remains at the portion of the wafer defined by the outer edge 403 of a screen print stencil. This thin band 405 still contains enough excess solder paste to cause the formation of oversize solder bumps.

What is needed is a manufacturable wafer scale process capable of forming uniformly sized solder bumps of less than about 300 $\mu$m in size on the electrical contacts of a plurality of semiconductor dies. Moreover, the process should prevent the formation of oversize solder bumps caused by the pooling of excess solder paste from around the edges of the wafer. Also needed are semiconductor wafer structures enabling the fabrication of uniform solder bumps.

SUMMARY OF THE INVENTION

In accordance with the principles of the present invention, the invention relates to structure and methods of forming solder electrical connectors for wafer scale semiconductor die fabrication.

In one embodiment the invention concerns methods of forming solder bump electrical connections to a plurality of electrical contact pads of a plurality of wafer-mounted semiconductor dies. The method involves providing a semiconductor wafer having a plurality of semiconductor dies and associated electrical contact pads formed thereon. A passivation layer is formed over the dies and contact pads with openings arranged in registration with the electrical contact pads. A layer of photodefinable material is formed on the wafer. The layer of photodefinable material is patterned such that an exposed photo mask ring is formed around the periphery of wafer with the photo mask ring having an inner boundary and an outer boundary. The inner boundary lies at a predetermined distance inward from the edge of the wafer. Subsequently, a pattern of openings is formed in the portion of the layer of photodefinable defined by the photo mask ring and such that the formation of openings is prevented around the periphery of wafer by the presence of the exposed photo mask ring. Additionally, the pattern of openings is in registration with the openings formed in the passivation layer and in registration with the electrical contact pads. Solder bumps are then formed in the openings to establish electrical connections to the plurality of electrical contact pads. The wafer is singulated to form individual semiconductor dies.

Another embodiment discloses a semiconductor wafer structure suitable for having a pattern of openings formed thereon such that solder electrical connections can be formed thereon. Such a wafer includes a semiconductor wafer substrate with a plurality of semiconductor dies and associated electrical contact pads formed thereon. A passivation layer is formed over the dies with openings in the passivation layer. The openings are arranged in registration with the electrical contact pads. The electrical contact pads also include under-bump metallization layer(s) formed thereon. A layer of exposed photodefinable material is formed on the wafer in a region around the periphery of wafer. This exposed photodefinable material comprises a photo mask ring and surrounds a layer of exposed photodefinable material inside the photo mask ring. The layer of exposed photodefinable material is in readiness for the formation of a pattern of openings within the photo mask ring, but not extending onto the photo mask ring. The pattern of openings is formed in registration with the openings formed in the passivation layer and in registration with the electrical contact pads. Such a substrate is suitable for the formation of solder bumps that establish electrical connections to the electrical contact pads.

These and other aspects of the invention will be disclosed in greater detail in the following detailed description.

BRIEF DESCRIPTION OF THE DRAWINGS

The following detailed description will be more readily understood in conjunction with the accompanying drawings, in which:

FIG. 5 is a cross-section view of a portion of a semiconductor die illustrating the oversize bump problem caused by a conventional solder bump fabrication processes.

DETAILED DESCRIPTION OF THE INVENTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

Figure 1:
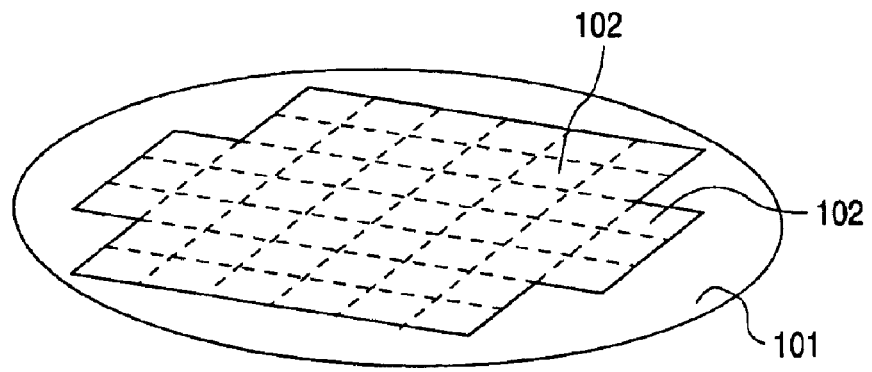
FIG. 1 is a simplified schematic perspective view of a wafer having a plurality of semiconductor dies formed thereon.
Figure 2:
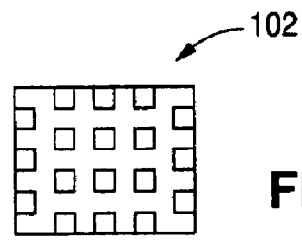
FIG. 2 is a simplified plan view of a semiconductor die having a plurality of electrical contact pads formed thereon.
Figure 3A:
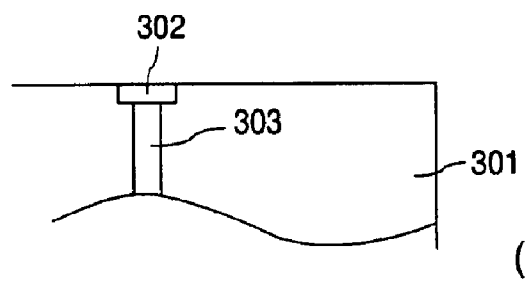
FIGS. 3(*a*)–3(*g*) are schematic cross-section views of a portion of a conventional semiconductor die illustrating aspects of a conventional solder ball formation process.
Figure 3B:
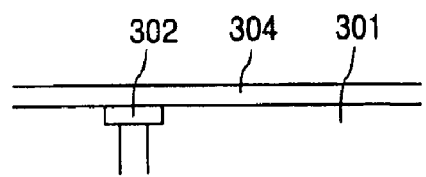
Figure 3C:
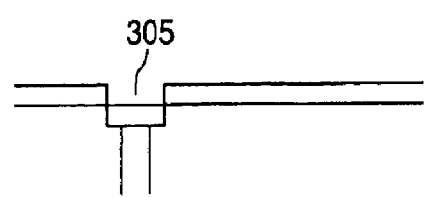
Figure 3D:
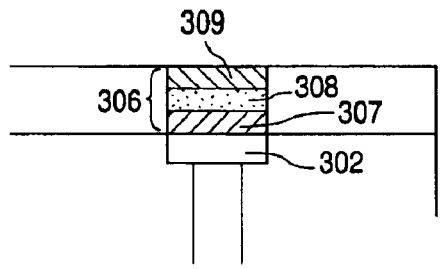
Figure 3E:
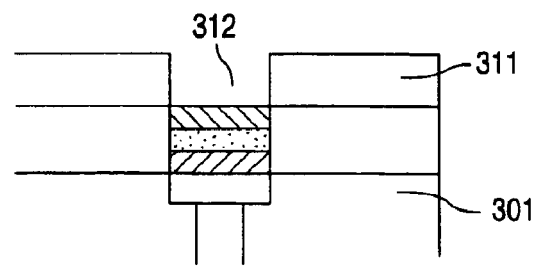
Figure 3F:
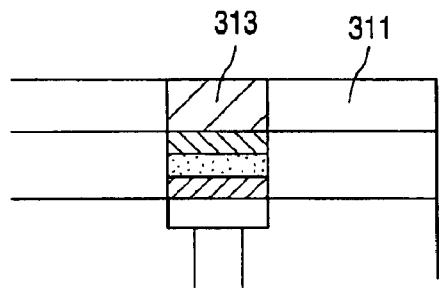
Figure 3G:
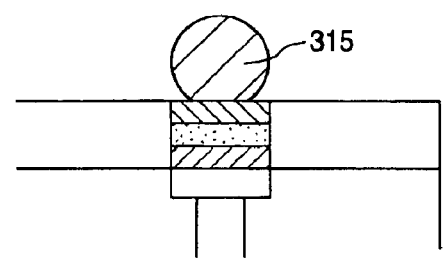
Figure 4A:
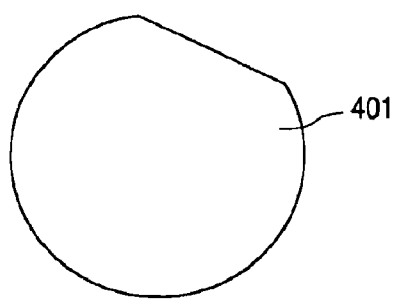
FIGS. 4(*a*)–4(*d*) are simplified plan views of a semiconductor wafer illustrating aspects of a conventional solder bump formation process.
Figure 4B:
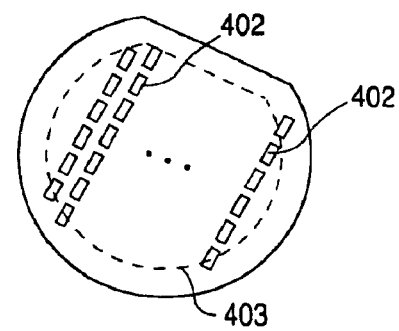

Aspects of the invention include methodologies for the wafer scale fabrication of solder bumps on a plurality of semiconductor integrated circuit dies formed on a semiconductor wafer. The processes used to form solder bumps in accordance with the principles of the invention are related to those conventional processes illustrated above. For example, a wafer is provided with a multiplicity of semiconductor integrated circuit dies formed thereon. A typical wafer in accordance with the principles of the invention is a 300 mm silicon wafer. However, as is known and appreciated by those having ordinary skill in the art, other wafer substrates can be used, including but not limited to, gallium arsenide (GaAs), gallium indium arsenide (GaInAs), or other semiconductor materials. Such wafers have a plurality of semiconductor dies formed thereon. Such dies typically include integrated circuit devices, but can also include any type of semiconductor device. The dies are formed having a multiplicity of electrical contact pads formed thereon. The contact pads can be formed of any conducting material, but in preferred embodiments the pads are formed of highly conductive metal metals or alloys. Typical examples include, but are not limited to aluminum, copper, and other conducting materials and alloys. However, as is known to persons having ordinary skill in the art, other conductive materials (e.g., suicides and other conductive materials) can be used. The contact pads are electrically connected to electrical circuitry forming part of the die. Methods of forming such wafers are well known in the art. An example of a suitable die is well discussed hereinabove with respect to FIG. 3(a). Further processing to form a passivation layer and a UBM metallization layer are also well described hereinabove with respect to FIGS. 3(b)–3(d). A UBM layer of the present invention can be formed of many materials having good adhesion to both the underlying electrical contact pads and the subsequently formed solder connections. Commonly, such UBM layers comprise more than one layer of materials. The inventors note that while the use of the UBM layer is preferred, it is not necessary to practice the invention.

At this point a layer of photodefinable material is formed over the entire wafer. Commonly, such material is a photoresist material. FIG. 6(a) is a simplified schematic depiction of wafer 601 having a plurality of semiconductor dies formed thereon (not depicted in this view). The depicted wafer is show with a layer of photodefinable material in place. The layer of photodefinable material will later be exposed and developed to form a solder mask having a pattern of openings therein. The dot/dashed line schematically demarcates the outer edge 603 of a screen print stencil used in the application of solder paste onto a pattern of openings to be formed in the layer of photodefinable material. As discussed previously, a ring 604 of excess solder paste is formed in the region beyond the edge 603 of the screen print stencil.

As stated previously, this proves problematic because the photolithographic stepper process results in a pattern of openings that extends into the ring 604 (i.e., the region beyond the edge 603 of the screen print stencil). This point is illustrated in simplified form in FIG. 6(b) wherein a photolithographically patterned opening 605 extends into in the region defined by the solder paste of the ring 604 (beyond the edge 603 of the screen print stencil). The consequences of this problem have already been explained previously, and need not be further discussed here. The inventors have discovered that they can selectively inactivate portions of the photodefinable material to prevent the formation of openings therein. As a result, solder does not pool in holes in the outer regions of the wafer 601. Consequently, oversize bumps are not formed. Thus, the problem of oversize bump formation can be remedied. Details of one approach for achieving this goal are illustrated herein below.

In FIG. 6(c), the wafer 601 is depicted with the edge 603 of the screen print stencil demarcated by the dot/dashed line. The inventors contemplate that by using a two-step process to process the photodefinable material, the formation of oversize solder bumps can be prevented. In a first step, a ring of the photodefinable material in a region around the periphery of wafer is exposed to form an exposed photo mask ring. By forming such an exposed photo mask ring, the formation of openings can be prevented in the regions beyond the edge 603 of the screen print stencil, thereby preventing the flow of solder into those openings thereby preventing the formation of oversize solder bumps. This exposed photo mask ring should be formed in a region around the periphery of wafer such that the exposed photo mask ring has an inner boundary 606 that lies within the outer edge 603 of the screen print stencil so that the stencil will overlap a portion of the resulting exposed photo mask ring. This is depicted in FIG. 6(c), which shows the intended inner boundary 606 (marked with a dashed line) of the exposed photo mask ring as being well within the edge 603 of the screen print stencil.

In a typical implementation, the edge 603 of the screen print stencil lies about 2 mm in from the edge of the wafer. The inner boundary 606 of the photo mask ring should extend further toward the center of the wafer 601. Thus, lying within the edge 603 of the screen print stencil. For example, in one preferred embodiment, where the edge 603 of the screen print stencil lies about 2 mm in from the edge of the wafer, the inner boundary 606 of the photo mask ring lies at about 2.5 mm from the edge of the wafer 601. Thus, as long as the distance $d_R$ that the inner boundary 606 of the exposed photo mask ring lies from the edge of the wafer is greater that the distance ds that the outer edge 603 of the screen print stencil lies from the edge of the wafer the process should be suitable.

FIG. 6(d) illustrates the wafer of FIG. 6(c) after a first photolithographic processing of the photodefinable material so that, in the region around the periphery of wafer, the layer of photodefinable material is patterned and exposed to form the exposed photo mask ring 611 which extends inward from the edge of the wafer such that the resulting exposed developed photo mask ring 611 is overlapped by the outer edge 603 of the screen print stencil. Moreover, inside the exposed developed photo mask ring 611 there is another region (an inner portion 610) wherein the layer of photodefinable material remains in readiness for subsequent photolithographic patterning (i.e., unexposed). Typically, this is achieved by choosing a photodefinable material where exposure to activating light polymerizes the photodefinable material. One suitable example being a negative photoresist material such as is commonly available from many manufactures. By masking the inner portion 610 and exposing the region around the periphery of wafer, subsequent processing of the region around the periphery of wafer (the outer region) leaves an exposed a developed photo mask ring 611 surrounding by an unpatterned and undeveloped central portion 610. Because the exposed photo mask ring 611 has already been processed, openings cannot be formed therein by further photolithographic processing. Additionally, the inner portion can still be exposed and patterned to obtain a desired pattern of openings in a solder mask used to establish electrical connections with the underlying semiconductor dies.

Figure 6E:
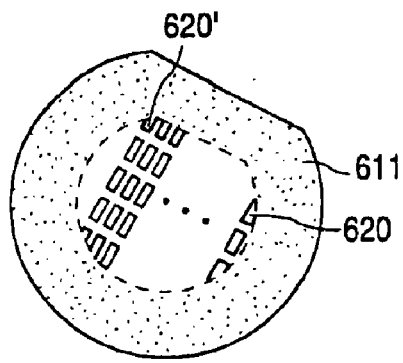
FIGS. 6(*a*)–6(*f*) are schematic plan views of a portion of a semiconductor wafer illustrating aspects of a wafer scale die fabrication process including solder bump fabrication process in accordance with the principles of the present invention.

Referring to FIG. 6(e), the wafer 601 (of FIG. 6(d)) is subject to a second step. A second photolithographic processing is performed to form a pattern of openings 620 within the unpatterned and undeveloped (e.g., unexposed) inner portion 610 of the photodefinable material to form a solder mask. As depicted herein the openings 620 of the solder mask are schematically depicted. The actual patterns of openings 620 are typically much smaller and configured to promote easy interconnection with specific customer electronic substrates (e.g., PCB's, electronic devices, and the like). In preferred embodiments, the openings 620 are formed of a size such that the resulting solder bumps will be less than about 300 µm in size. In a still more preferred embodiment, the dimensions of the openings 620 are configured such that the resulting solder bumps have are less than about 150 µm in size. The pattern of openings 620 of the resulting solder mask are formed in registration with the openings formed in the underlying passivation layer and underlying electrical contact pads. Due to the previous exposure of photo mask ring 611, the openings 620 do not extend onto the exposed photo mask ring 611. For example, an opening 620' cannot be formed on the previously exposed developed photo mask ring 611.

Figure 6F:
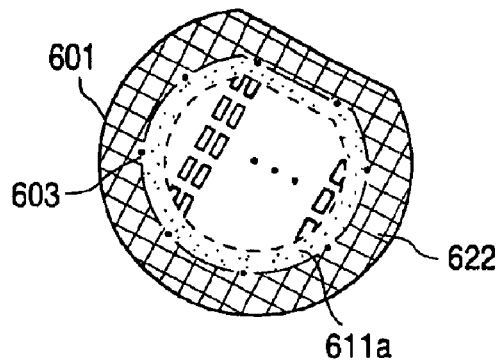

Referring to FIG. 6(f), after the formation of the photo mask ring 611 and the subsequent formation of the pattern of openings 620 (the solder mask) in the inner portion 610, a solder paste material is applied to the wafer 601. The solder paste is applied through a screen print stencil in a conventional screen printing process in order to fill the openings in the solder mask with solder paste. One type of device that can be used to apply the solder paste is an automated printing machine such as is available from DEK Printing Machines, Ltd. of the United Kingdom. Many different solder materials can be used. However, typical solder materials include, but are not limited to eutectic solders (e.g., tin (Sn)/silver (Ag)/lead (Pb) solders and Sn/Pb solders). Also, the inventors specifically contemplate the use of lead-free solders. After the solder paste is deposited into the openings 620 of the solder mask, the excess solder paste is scrapped off the screen print stencil. Thus, the pattern of openings 620 is filled with solder paste. The process of scraping the stencil leaves a residue of solder paste at the outer edge of the screen printing stencil. In accordance with the principles of the invention, the edge of the stencil 603 extends beyond the inner boundary 606 of the photo mask ring 611 so that the stencil overlaps a portion of the photo mask ring 611. As a result, the solder paste residue (depicted by the cross-hashed area) is only formed in an edge region 622 of the wafer beyond the pattern of openings 620. Significantly, a thin portion 611a of the photo mask ring 611 physically separates the pattern of openings 620 of the solder mask from the solder paste residue containing edge region 622. As a result, during subsequent reflow processes used to form solder bumps in the openings 620 the solder paste residue containing at the edge region 622 does not reflow into the openings 620 of the solder mask. As a result, no oversize solder bumps are formed on the wafer.

Figure 7A:
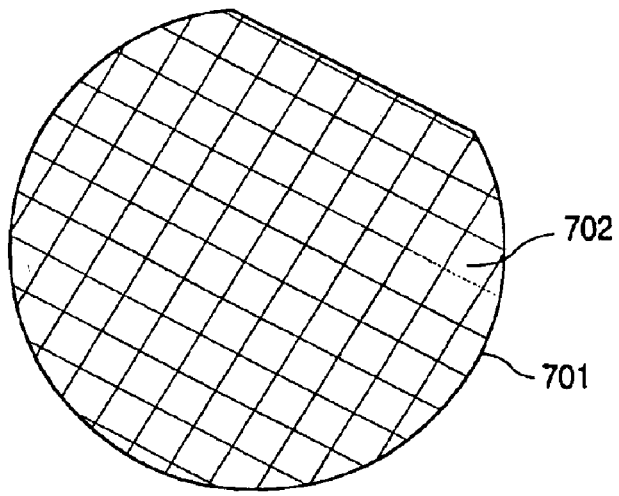
FIGS. 7(*a*)–7(*b*) are depictions of a wafer singulation process and the resulting semiconductor integrated circuit die fabricating in accordance with the principles of the present invention It is to be understood that in the drawings like reference numerals designate like structural elements. Also, it is specifically pointed out that the depictions in the drawings are not necessarily to scale.
Figure 7B:
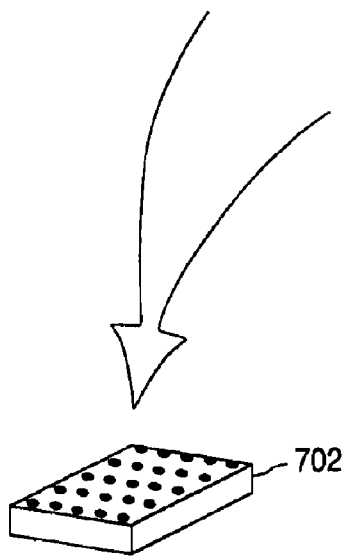

Once the solder paste has been screen printed in place. The wafer can be reflowed to form solder bumps on each die and the photodefinable material is removed, leaving a semiconductor wafer having a plurality of package dies formed thereon. As depicted schematically, in FIGS. 7(a) and 7(b), the wafer 701 having a plurality of semiconductor dies 702 formed thereon is singulated into a plurality of individual dies 702. For clarity, throughout the specification and claims, the term singulate has a broad meaning and refers to any process used to separate the dies 702 from the wafer 701. Typical examples include, without limitation, etching, sawing, sandblasting and milling. In one embodiment the dies 702 are singulated by cutting with a scribing apparatus such as a Kulicke & Soffa 775 dicing saw employing an Ni plated diamond loaded blade. The processes described herein can be used to fabricate semiconductor dies 702 comprising a wide range of semiconductor devices that include, but are not limited to, microprocessors, ASIC's, memory devices, PLD's, optical and electro-optical devices, as well as many different types of integrated circuit devices.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A method of forming solder bump electrical connections to a plurality of electrical contact pads of a plurality of wafer-mounted semiconductor dies, the method comprising:

providing a semiconductor wafer having a plurality of semiconductor dies and associated electrical contact pads formed thereon, the wafer having a passivation layer having openings therein, the openings being in registration with the contact pads, the layer including a layer of photodefinable material formed over the passivation layer;

photolithographically processing the photodefinable material in a manner such that, in the region around the periphery of wafer, the layer of photodefinable material is exposed to an illumination source thereby forming a photo mask ring of exposed photodefinable material in a region around the periphery of wafer such that the photo mask ring has an inner boundary and an outer boundary with the inner boundary extending a distance inward from the edge of the wafer and such that another region of the layer of photodefinable material-inside the inner boundary of the photo mask ring remains unpatterned and undeveloped; and further photolithographically processing said another region to form a pattern of openings in the layer of photodefinable material inside the the inner born photo mask ring, the pattern of openings being formed in registration with openings formed in the passivation layer and in registration with the electrical contact pads to form a solder mask, the openings not extending onto the photo mask ring;

forming solder bumps to establish electrical connections to the plurality of electrical contact pads; and singulating the wafer to form individual semiconductor dies.

2. The method of claim 1 wherein forming the layer of photodefinable material on the wafer comprises forming a layer of negative photoresist on the wafer.

3. The method of claim 2 wherein
the photolithographic processing comprises:
exposing the negative photoresist in the region around the periphery of wafer; and
wherein the further photolithographic processing comprises:
exposing the negative photoresist inside the photo mask ring so that a pattern of exposures is formed inside the photo mask ring, the pattern of exposures being in registration with the openings formed in the passivation layer and in registration with the electrical contact pads; and
developing the exposed pattern of exposures to form a solder mask within the photo mask ring so that a pattern of openings is formed in registration with the openings formed in the passivation layer, the openings not extending onto the developed photo mask ring the pattern of openings in the solder mask exposes the underlying electrical contact pads.

4. The method of claim 3 wherein providing the semiconductor wafer having a plurality of semiconductor dies and associated electrical contact pads formed thereon includes providing a wafer having a passivation layer formed over the dies with openings in the passivation layer arranged in registration with the electrical contact pads enabling the formation of under-bump metallization on the electrical contact pads; and
wherein developing the exposed pattern of exposures inside the photo mask ring to form the solder mask includes forming a pattern of openings that exposes the underlying under-bump metallization on the electrical contact pads, the openings being prevented from extending onto the developed photo mask ring by the presence of the developed photoresist layer; and
wherein reflowing the solder material to form electrical connections includes forming electrical connections to the to the under-bump metallization on the electrical contact pads.

5. The method of claim 4 wherein the applying of the solder material to the openings of the solder mask comprises screen printing a solder paste.

6. The method of claim 5 wherein the applying of the solder material to the openings in the solder mask comprises screen printing the solder paste onto the substrate using a screen printing stencil that extends beyond an innermost edge of the developed photo mask ring.

7. The method of claim 4 wherein the applying a solder material and reflowing the solder material to forming electrical connections to the to the under-bump metallization on the electrical contact pads includes forming solder bumps having a diameter of less than about 300 $\mu$m (micron).

8. The method of claim 7 wherein the applying a solder material and reflowing the solder material to forming electrical connections to the to the under-bump metallization on the electrical contact pads includes forming solder bumps having a diameter of less than about 150 $\mu$m.

9. The method of claim 1 wherein the applying of the solder material to the openings formed in the solder mask comprises screen printing a solder paste.

10. The method of claim 9 wherein the applying of the solder paste includes screen printing the solder paste through a screen printing stencil wherein the outer edge of the screen printing stencil extends beyond the inner boundary of the photo mask ring so that the stencil overlaps a portion of the photo mask ring.

11. The method of claim 1 wherein forming solder bumps to form electrical connections to the plurality of electrical contact pads includes forming solder bumps having a diameter of less than about 300 $\mu$m (micron).

12. The method of claim 11 wherein forming solder bumps to form electrical connections to the plurality of electrical contact pads includes forming solder bumps having a diameter of less than about 150 $\mu$m.

13. The semiconductor wafer of claim 1 wherein the photolithographic processing is conducted by exposing the region around the periphery of wafer to an illumination source while the region of the layer of photodefinable material inside the inner boundary of the photo mask ring is masked thereby preventing its exposure to the illumination source.

* * * * *

UNITED STATES PATENT AND TRADEMARK OFFICE
CERTIFICATE OF CORRECTION

PATENT NO. : 6,864,167 B1
DATED : March 8, 2005
INVENTOR(S) : Tharumalingam et al.

It is certified that error appears in the above-identified patent and that said Letters Patent is hereby corrected as shown below:

Column 5,
Line 31, change "suicides and" to -- silicides and --.

Column 6,
Lines 51 and 53, delete "developed".
Line 64, delete "a developed".

Column 7,
Line 28, delete "developed".

Column 8,
Line 60, change "the the inner born" to -- the inner boundary of the --.

Signed and Sealed this

Seventh Day of June, 2005

JON W. DUDAS
*Director of the United States Patent and Trademark Office*